(12) United States Patent
Blanchard et al.

(10) Patent No.: US 9,935,188 B2
(45) Date of Patent: Apr. 3, 2018

(54) INSULATED GATE TURN-OFF DEVICE WITH TURN-OFF SCHOTTKY-BARRIER MOSFET

(71) Applicant: Pakal Technologies, LLC, San Francisco, CA (US)

(72) Inventors: Richard A. Blanchard, Los Altos, CA (US); Vladimir Rodov, Seattle, WA (US); Hidenori Akiyama, Miyagi (JP); Woytek Tworzydlo, Austin, TX (US)

(73) Assignee: Pakal Technologies LLC, San Francisco, CA (US)

( * ) Notice: Subject to any disclaimer, the term of this patent is extended or adjusted under 35 U.S.C. 154(b) by 0 days.

(21) Appl. No.: 15/655,715

(22) Filed: Jul. 20, 2017

(65) Prior Publication Data

US 2018/0026121 A1    Jan. 25, 2018

Related U.S. Application Data

(60) Provisional application No. 62/365,739, filed on Jul. 22, 2016.

(51) Int. Cl.
*H01L 29/78* (2006.01)
*H01L 29/739* (2006.01)
(Continued)

(52) U.S. Cl.
CPC ...... *H01L 29/7396* (2013.01); *H01L 27/0716* (2013.01); *H01L 29/083* (2013.01);
(Continued)

(58) Field of Classification Search
CPC . H01L 27/0716; H01L 29/083; H01L 29/105; H01L 29/1095; H01L 29/47;
(Continued)

(56) References Cited

U.S. PATENT DOCUMENTS 6,265,735 B1 * 7/2001 Takahashi ........... H01L 29/0692
257/135
6,399,998 B1 * 6/2002 Chang ................. H01L 29/1095
257/139
(Continued)

FOREIGN PATENT DOCUMENTS

EP          0107773 A1    5/1984
JP          H11-251573 A  9/1999

OTHER PUBLICATIONS

Kobayashi et al., "100 V Class Multiple Stepped Oxide Field Plate Trench MOSFET (MSO-FP-MOSFET) Aimed to Ultimate Structure Realization", Proceedings of the 27th International Symposium on Power Semiconductor Devices & IC's May 10-14, 2015, Kowloon Shangri-La, Hong Kong, 4 pages.
(Continued)

*Primary Examiner* — Daniel Luke
*Assistant Examiner* — Khatib Rahman
(74) *Attorney, Agent, or Firm* — Patent Law Group LLP; Brian D. Ogonowsky

(57) ABSTRACT

An insulated gate turn-off (IGTO) device, formed as a die, has a layered structure including a p+ layer (e.g., a substrate), an n− epi layer, a p-well, vertical insulated gate electrodes formed in the p-well, and n+ regions between the gate electrodes, so that vertical npn and pnp transistors are formed. The device is formed of a matrix of cells. To turn the device on, a positive voltage is applied to the gate electrodes, referenced to the cathode. The cells further contain a vertical p-channel MOSFET, for shorting the base of the npn transistor to its emitter, to turn the npn transistor off when the p-channel MOSFET is turned on by a slight negative voltage applied to the gate. The p-channel MOSFET includes a Schottky source formed in the top surface of the npn transistor emitter.

13 Claims, 2 Drawing Sheets

(51) Int. Cl.
*H01L 29/47* (2006.01)
*H01L 29/10* (2006.01)
*H01L 29/08* (2006.01)
*H01L 27/07* (2006.01)

(52) U.S. Cl.
CPC ............ *H01L 29/105* (2013.01); *H01L 29/47* (2013.01); *H01L 29/7813* (2013.01); *H01L 29/7839* (2013.01)

(58) Field of Classification Search
CPC ............ H01L 29/7396; H01L 27/0635; H01L 29/0696; H01L 29/7375; H01L 29/7393–29/7395; H01L 29/7397; H01L 29/66325; H01L 29/66333–29/663348; H01L 2924/13017; H01L 29/87–29/8725; H01L 29/7813; H01L 29/7839
See application file for complete search history.

(56) References Cited

U.S. PATENT DOCUMENTS

| | | | |
|---|---|---|---|
| 9,391,184 B2 | 7/2016 | Rodov et al. | |
| 2003/0089966 A1* | 5/2003 | Hattori | H01L 29/1095 257/565 |
| 2005/0258479 A1 | 11/2005 | Ono et al. | |
| 2014/0034995 A1* | 2/2014 | Akiyama | H01L 29/7455 257/119 |
| 2014/0048847 A1* | 2/2014 | Yamashita | H01L 29/407 257/140 |
| 2015/0249083 A1* | 9/2015 | Okawara | H01L 27/0635 257/140 |
| 2017/0271437 A1* | 9/2017 | Kono | H01L 29/063 |

OTHER PUBLICATIONS

Larson et al., "Overview and Status of Metal S/D Schottky-Barrier MOSFET Technology", IEEE Transactions on Electron Devices, vol. 53, No. 5, May 2006, 11 pages.
Zhu et al., "Schottky-Barrier S/D MOSFETs with High-K Gate Dielectrics and Metal-Gate Electrode", IEEE Electron Device Letters, vol. 25, No. 5, May 2004, 3 pages.
Jian et al., "Simulation Study of an Injection Enhanced Insulated-Gate Bipolar Transistor with p-Base Schottky Contact", IEEE Transactions on Electron Devices, vol. 63, No. 5, May 2016, 5 pages.
PCT/US2017/043269, "International Search Report and Written Opinion", dated Oct. 10, 2017, 13 pages.

* cited by examiner

INSULATED GATE TURN-OFF DEVICE WITH TURN-OFF SCHOTTKY-BARRIER MOSFET

CROSS-REFERENCE TO RELATED APPLICATIONS

This application is based on provisional application Ser. No. 62/365,739, filed Jul. 22, 2016, by Richard A. Blanchard et al., assigned to the present assignee and incorporated herein by reference.

FIELD OF THE INVENTION

This invention relates to insulated gate turn-off (IGTO) devices and, more particularly, to an IGTO device design that includes an improved turn-off feature.

BACKGROUND

The inventors' U.S. Pat. No. 9,391,184, incorporated herein by reference, discloses prior art FIGS. 1 and 2. The present invention is an improvement of the PMOS turn-off transistor described in U.S. Pat. No. 9,391,184.

FIG. 1 is a cross-sectional view of a single cell of an IGTO device, formed as a single die. The cell repeats in an array of cells, formed in a common p-well, connected in parallel for potentially conducting a high current. The cells can be in long strips or other shapes, such as squares, hexagons, etc.

FIG. 2 is an equivalent circuit.

The vertical gate electrodes 12 are insulated from the p-well 14 by an oxide layer 22. The gate electrodes 12 (doped polysilicon) are connected together outside the plane of the drawing and are coupled to a gate voltage via the gate interconnect 25 contacting the polysilicon.

A vertical npnp semiconductor layered structure is formed. There is a bipolar pnp transistor 31 (FIG. 2) formed by a p+ substrate 30, an n− epitaxial (epi) layer 32, and the p-well 14. There is also a bipolar npn transistor 64 (FIG. 2) formed by the n-epi layer 32, the p-well 14, and the n-layer 50 in conjunction with the n+ contact 52. An n-type buffer layer 35, with a dopant concentration higher than that of the n− epi layer 32, reduces the injection of holes into the n− epi layer 32 from the p+ substrate 30 when the device is conducting. A bottom anode electrode 36 contacts the substrate 30, and a cathode electrode 20 contacts the n+ contact 52 and the p+ region 54. The p-well 14 surrounds the gate structure, and the n− epi layer 32 extends to the surface around the p-well 14.

When the anode electrode 36 is forward biased with respect to the cathode electrode 20, but without a sufficiently positive gate electrode bias, there is no current flow, since the product of the betas (gains) of the pnp and npn transistors is less than one (i.e., there is no regeneration action).

When the gate electrode is biased to a voltage above the threshold voltage of the n-channel MOSFET 62, electrons from the n+ contact 52 and n-layer 50 become the majority carriers along the gate electrode sidewalls and below the bottom of the trenches in an inversion layer, causing the effective width of the npn base (the portion of the p-well 14 between the p-layers) to be reduced. As a result, the beta of the "narrow-base" npn transistor 60 increases to cause the product of the betas to exceed one. This results in "breakover," when holes are injected into the lightly doped n− epi layer 32 and electrons are injected into the p-well 14 to fully turn on the device. Accordingly, a bias on the gate electrode 12 initiates the turn-on, and the full turn-on (due to regenerative action) occurs when there is current flow through the npn and pnp transistors.

The p+ region 54 is formed on both sides of the n+ contact 52, adjacent the gate electrode 12, and extends below the n+ contact 52. The n-layer 50 typically extends below the p+ region 54 to form a channel in a p-channel MOSFET 58 between the base and emitter of the npn transistor 60/64, shown in the equivalent circuit of FIG. 2. The n-layer 50 can also be referred to as a body region of a DMOS transistor.

As mentioned above, when the IGTO device is turned on by a positive gate voltage, both the npn transistor and the pnp transistor are turned on. If the p+ region 54 was not present, the IGTO device could be turned off by pulling the gate interconnect 25 negative or shorting it to the cathode. This creates the wide-base npn transistor 64 having a low beta, resulting in the product of the npn and pnp transistor betas being less than one, turning the IGTO device off. However, when the current through the IGTO device is sufficiently high, latch-up occurs, initiating thyristor action, and the device cannot be turned off simply by shorting the gate interconnect 25 to the cathode electrode 20. Latch-up can be beneficial since it lowers the voltage drop across the device. By applying a negative gate voltage exceeding the threshold voltage of the p-channel MOSFET 58, the n-layer 50 adjacent to the gate electrode 12 inverts to create a conducting p-channel between the p+ region 54 and the p-well 14. This conducting p-channel MOSFET 58 essentially shorts the base-emitter diode of the npn transistor 60/64, forcing the npn transistor 60/64 to turn off. Therefore, there is no further regenerative action.

Accordingly, the IGTO device of FIG. 1 may be reliably turned off after being in latch-up with only a small negative gate threshold voltage for the p-channel MOSFET 58

Although the IGTO device of FIG. 1 operates well, it is still desirable to improve its performance and simplify processing.

SUMMARY

An IGTO device is similar to that of FIG. 1 but replaces the p+ region, forming the source of the p-channel MOSFET (turn-off transistor), with a p-type Schottky source. To do this, the top silicon surface adjacent to the gate electrode is contacted by a suitable conductor such as a metal silicide, for example PtSi, to form a Schottky barrier for supplying holes. Between the vertical gate electrodes is a center n+ contact (part of the npn transistor emitter), which is relatively deep. The silicide may also be formed over the n+ contact but has no effect, since the high dopant concentration of the n+ contact just creates an ohmic contact with the silicide. As long as the n+ contact doping concentration is above about $2 \times 10^{19}/cm^3$, the resulting Schottky barrier will be so thin that carriers tunnel through it, forming a "degenerate" Schottky barrier, which behaves like a low resistance ohmic contact.

The cathode electrode metal is then deposited over the surface, which electrically contacts the Schottky source and the center n+ contact. Thus, the same silicide layer acts as a Schottky source for the p-channel MOSFET as well as an ohmic contact for the npn transistor emitter. This behavior means that the electrical characteristics of the Schottky source can be adjusted with no concern about the performance of the ohmic contact to the n+ region.

Let's assume that the IGTO device is on, with both the vertical pnp and npn transistors biased on so as to conduct a vertical current between the cathode and anode electrodes.

When it is desired to turn the IGTO device off, the vertical gate electrode is negatively biased with respect to the cathode electrode, causing holes from the Schottky source to form an inversion layer adjacent to the gate electrode. This action creates a conducting channel in the vertical p-channel MOSFET that effectively shorts the npn transistor base-emitter regions together, which forces the npn transistor to turn off. As a result, current flow ceases.

The benefits of using the Schottky source in the p-channel MOSFET, instead of using a p+ source, include: 1) fewer processing steps since the p+ source does not need to be formed; 2) a smaller required area for the Schottky source, enabling the cell to be smaller and, hence, the trenches to be closer together for increased efficiency; and 3) faster turn-off time. The use of a Schottky source in the p-channel MOSFET is particularly beneficial in IGTO devices designed to operate above 1000 volts, since the Schottky structure can be included without any doping constraints in the vertical structure.

BRIEF DESCRIPTION OF THE DRAWINGS

Elements that are the same or equivalent are labelled with the same numerals.

DETAILED DESCRIPTION

Since the inventive device may be identical to that of FIG. 1 except for the formation of the p-channel turn-off MOSFET, the below description focuses mainly on the differences, and the description of the common features is described above with reference to FIGS. 1 and 2 and the inventors' U.S. Pat. No. 9,391,184.

Figure 3:
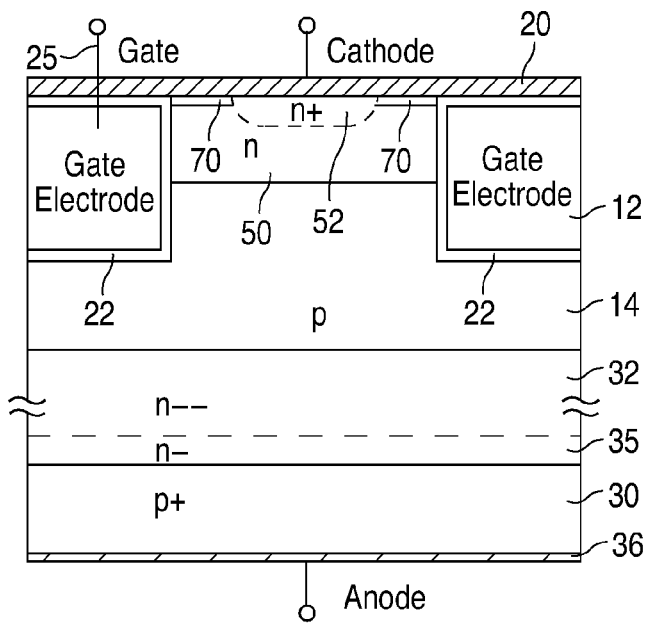
FIG. 3 illustrates the cell of FIG. 1 but where the p+ source of the p-channel turn-off MOSFET has been replaced with a Schottky source.

FIG. 3 is a cross-sectional view of a single cell in an array of identical cells. The gate electrodes 12 may be formed in parallel strips, with the doped regions between adjacent gate electrodes. All of the gate electrodes 12 are connected in parallel.

As previously described, the IGTO device forms an npnp vertical structure comprising a vertical npn bipolar transistor and a vertical pnp bipolar transistor. When the cathode and anode electrodes are forward biased and the gate electrode 12 voltage is above the threshold voltage, the base of the npn transistor is narrowed, which increases its beta so that the product of the betas of the npn and pnp transistors is greater than one. At that point, regenerative action begins to fully turn the IGTO device on.

To force the IGTO off under all conditions (including latch-up), a p-channel MOSFET, using a Schottky source, is formed to essentially short together the base-emitter of the npn transistor to turn the npn transistor off. The p-channel MOSFET threshold voltage is only slightly negative and very repeatable.

Figure 1:
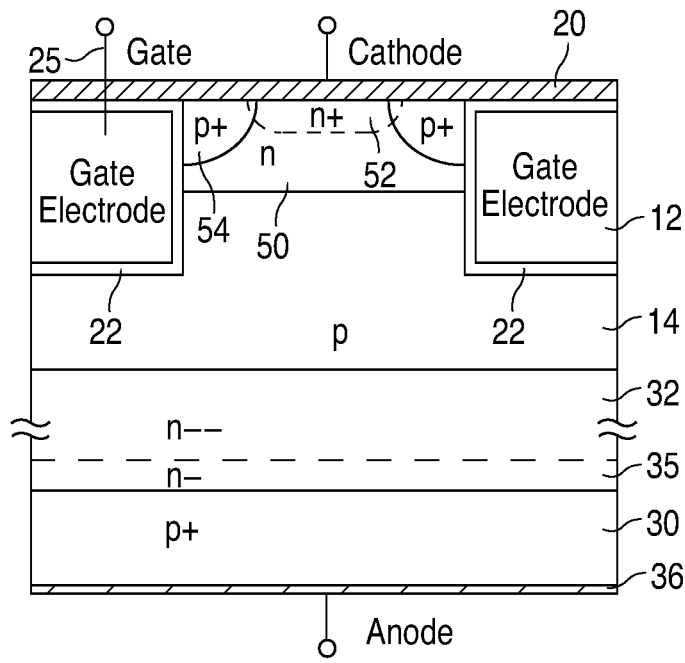
FIG. 1 is a cross-sectional view of a single cell in an IGTO device disclosed in the inventors' U.S. Pat. No. 9,391,184.
Figure 2:
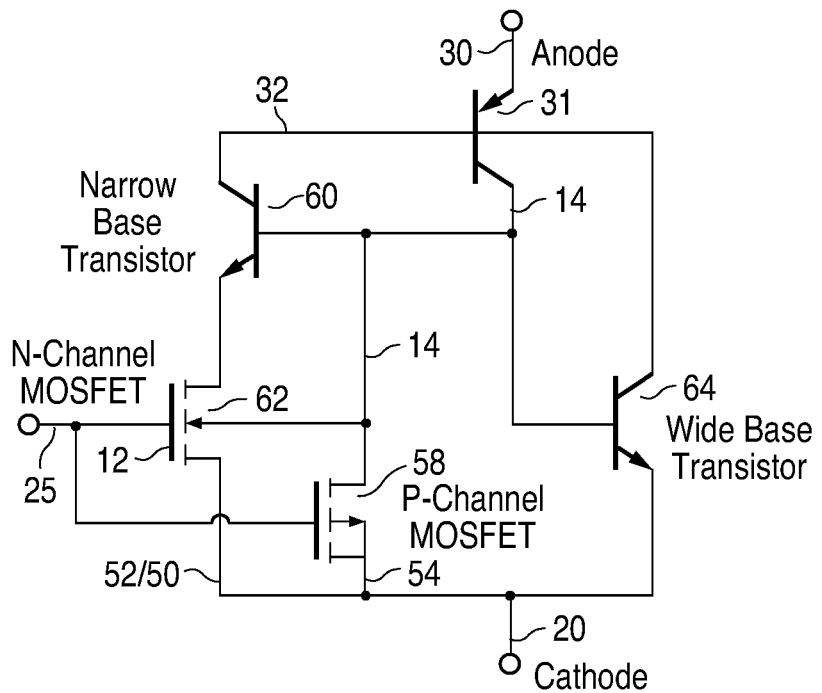
FIG. 2 is an equivalent circuit of the cell of FIG. 1.
Figure 4:
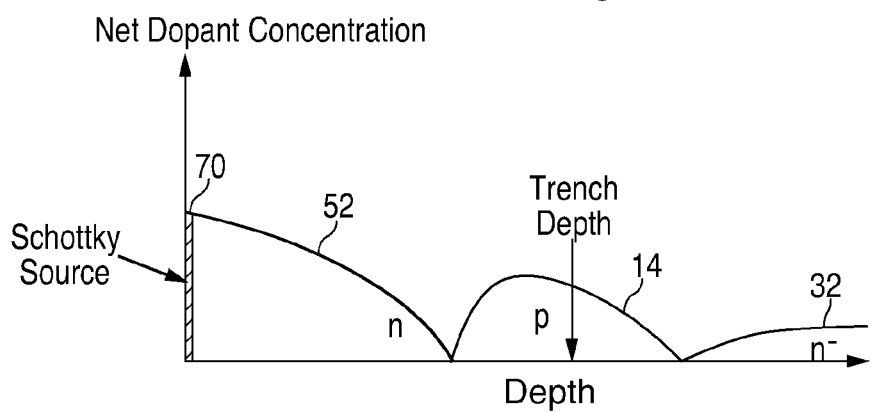
FIG. 4 illustrates the dopant profile of the IGTO device of FIG. 3.
Figure 5:
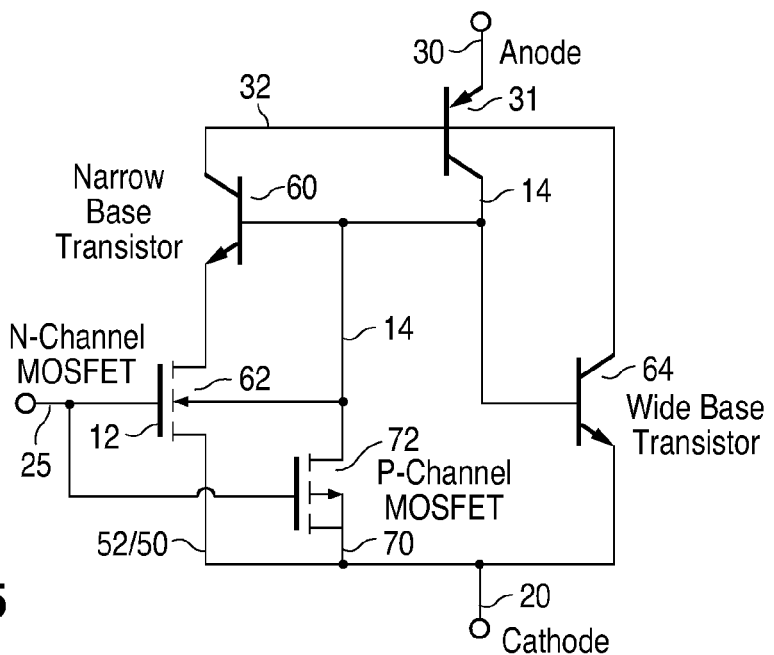
FIG. 5 is an equivalent circuit of the cell of FIG. 3.

FIG. 3 is a cross-sectional view of a single cell of an IGTO device, formed as a single die, in accordance with one embodiment of the invention. FIG. 4 is a dopant profile from the top silicon surface through to the n-epi layer 32 along the gate sidewall. FIG. 5 is an equivalent circuit. Elements that are the same as in FIGS. 1 and 2 are equivalent and their description is not repeated in detail.

It is known to form a MOSFET with a Schottky source and drain, and such a MOSFET is referred to as a Schottky-barrier (SB) MOSFET. Short channels may be fabricated since there is no diffusion of p-type dopants to form the source and drain. In such SB MOSFETs, both the source and drains are formed of the Schottky conductor. Many papers describe forming SB MOSFETs including, "Overview and Status of Metal S/D Schottky-Barrier MOSFET Technology," John Larson et al., IEEE Trans. on Elec. Devices, vol. 53, no. 5, May 2006; and "Schottky-Barrier S/D MOSFETs with High-K Gate Dielectrics and Metal-Gate Electrode," Shiyang Zhu et al., IEEE Elec. Device Letters, vol. 25, no. 5, May 2004, both incorporated herein by reference.

Instead of using a p+ region 54 (FIG. 1) as the source of the vertical p-channel MOSFET, a Schottky source is used. In FIG. 3, a p-type Schottky conductor 70, such as a metal or a metal silicide, is deposited on or formed in the top surface of the n-layer 50 to form the Schottky source. The Schottky conductor 70 is used to supply holes. Possible Schottky conductors include PtSi, PdSi, or other suitable silicides or metals. The carrier concentration at the surface of the n-type surface may first need to be adjusted to lower the effective n-type dopant concentration, for instance using ion implantation of boron, to obtain more efficient Schottky diode performance. Accordingly, the p-channel MOSFET uses a Schottky conductor as the source and the p-well 14 as the drain.

In one embodiment, a platinum layer is deposited over the surface, and the platinum-silicon interface is annealed to form PtSi (the Schottky conductor 70). The excess platinum is removed. A thin TiN barrier layer is then deposited to electrically contact the PtSi and any exposed silicon. An aluminum layer is then deposited over the TiN barrier layer to complete the cathode electrode 20.

It is optional whether the Schottky conductor 70 is also formed over the n+ contact 52, since it has no effect either way. Due to the high dopant concentration of the n+ contact 52 and its depth, the silicide will just form an ohmic contact with the n+ contact 52. The Schottky conductor 70 near the gate electrode 12 only has an effect as a Schottky source due to the relatively low dopant concentration of the n-layer 50.

FIG. 4 illustrates the dopant profile extending from the surface of the Schottky conductor 70 down to the n-epi layer 32. The depth of the gate electrode trench is shown within the p-well 14.

FIG. 5 shows an equivalent circuit. All components and its operation are the same as described with respect to FIG. 2 except for the operation of the p-channel MOSFET 72. To turn off the IGTO device, the gate electrode 12 is made negative with respect to the cathode electrode 20. Holes from the Schottky conductor 70, as a result of the negative potential on the gate electrode 12, can then flow along a p-type inversion layer formed along the vertical sidewall of the gate electrode 12, which forms a conducting channel between the base (p-well 14) and emitter (n regions 52/50) of the npn transistor 60/64 to turn it off.

Eliminating the p+ region 54 in FIG. 1 reduces the number of processing steps. Further, the surface area required by the Schottky source can be very small since it is not limited by the diffusion of p-type dopants in the silicon. Further, the same Schottky conductor 70 acts as a source as well as provides good ohmic contact with the n+ contact 52. Additionally, the use of the Schottky source instead of a doped source results in faster switching.

This technique of using a vertical MOSFET with a Schottky conductor source and a doped drain to turn off an IGTO device may be employed in various other designs of IGTO devices and is not limited to only the embodiments shown.

The conductivities of the various semiconductor regions may be reversed, and the Schottky conductor may then be an n-type Schottky conductor, such as dysprosium silicide (DiSi) or erbium silicide (ErSi), for providing electrons for inverting the region adjacent to the insulated gate electrode. The turn-off MOSFET will then be an n-channel type.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An insulated gate turn-off (IGTO) device formed as a die comprising:
   a first semiconductor layer of a first conductivity type;
   a second semiconductor layer of a second conductivity type overlying the first semiconductor layer;
   a third semiconductor layer of the first conductivity type overlying at least a portion of the second semiconductor layer;
   an array of cells comprising a plurality of insulated gate electrodes within trenches not extending through the third semiconductor layer;
   at least some of the cells comprising:
      a first semiconductor region of the second conductivity type overlying the third semiconductor layer and adjacent to an insulated gate electrode;
      a second semiconductor region of the second conductivity type overlying at least part of the first semiconductor region and being more highly doped than the first semiconductor region; and
      a Schottky conductor overlying and contacting at least a top surface of the first semiconductor region adjacent to the insulated gate electrode,
   wherein the Schottky conductor, the first semiconductor region, and the third semiconductor layer form a MOSFET, wherein a voltage applied to the insulated gate electrode greater than a threshold voltage of the MOSFET inverts the first semiconductor region adjacent to the insulated gate electrode to form a lower resistance path between the Schottky conductor and the third semiconductor layer to reduce a beta of a bipolar transistor formed by the first semiconductor region, the third semiconductor layer, and the second semiconductor layer to turn off the IGTO device.

2. The device of claim 1 wherein the first conductivity type is a p-type, the second conductivity type is an n-type, and the Schottky conductor provides holes for conducting through a channel induced in the first semiconductor region adjacent to the insulated gate electrode.

3. The device of claim 1 wherein the first conductivity type is an n-type, the second conductivity type is a p-type, and the Schottky conductor provides electrons for conducting through a channel induced in the first semiconductor region adjacent to the insulated gate electrode.

4. The device of claim 1 further comprising a cathode electrode electrically contacting the Schottky conductor and the second semiconductor region.

5. The device of claim 1 wherein the cathode electrode is in ohmic contact with the second semiconductor region.

6. The device of claim 1 wherein the Schottky conductor is a silicide formed in the first semiconductor region.

7. The device of claim 1 wherein the Schottky conductor also contacts a top surface of the second semiconductor region and forms an ohmic contact with the second semiconductor region.

8. The device of claim 1 wherein the first semiconductor layer is a growth substrate.

9. The device of claim 1 wherein the third semiconductor layer is formed as a well.

10. The device of claim 1 wherein the first semiconductor region is formed as an epitaxial layer.

11. The device of claim 1 wherein the first semiconductor region is formed as a doped region.

12. The device of claim 1 further comprising an anode electrode electrically contacting the first semiconductor layer.

13. The device of claim 1 wherein the first semiconductor region extends between adjacent insulated gate electrodes, and the second semiconductor region is formed in a center area between the adjacent insulated gate electrodes.

* * * * *